United States Patent
Kwong et al.

(10) Patent No.: US 6,184,730 B1
(45) Date of Patent: Feb. 6, 2001

(54) CMOS OUTPUT BUFFER WITH NEGATIVE FEEDBACK DYNAMIC-DRIVE CONTROL AND DUAL P,N ACTIVE-TERMINATION TRANSMISSION GATES

(75) Inventors: David Kwong, Fremont; Baohua Chen, Mountain View, both of CA (US)

(73) Assignee: Pericom Semiconductor Corp., San Jose, CA (US)

( * ) Notice: Under 35 U.S.C. 154(b), the term of this patent shall be extended for 0 days.

(21) Appl. No.: 09/432,368

(22) Filed: Nov. 3, 1999

(51) Int. Cl.[7] ............................... H03B 1/00; H03K 3/00
(52) U.S. Cl. ............................................. 327/112; 327/389
(58) Field of Search ........................... 327/108, 109, 327/111, 112, 379, 389, 427, 434, 437; 326/82, 83, 85, 87, 27

(56) References Cited

U.S. PATENT DOCUMENTS

| | | | |
|---|---|---|---|
| 4,782,252 | 11/1988 | Levy et al. | 307/576 |
| 5,212,801 | 5/1993 | Farmer | 395/800 |
| 5,218,239 | 6/1993 | Boomer | 307/443 |
| 5,241,221 | 8/1993 | Fletcher et al. | 307/263 |
| 5,319,252 | 6/1994 | Pierce et al. | 307/263 |
| 5,347,177 | 9/1994 | Lipp | 307/443 |
| 5,387,879 | 2/1995 | Satoh | 330/282 |
| 5,438,277 | 8/1995 | Sharpe-Geisler | 326/27 |
| 5,559,447 | 9/1996 | Rees | 326/30 |
| 5,682,110 | * 10/1997 | Rountree | 327/108 |
| 5,717,343 | 2/1998 | Kwong | 326/27 |
| 5,801,550 | 9/1998 | Tanaka et al. | 326/87 |
| 5,818,260 | 10/1998 | Kuo | 326/86 |
| 5,917,335 | 6/1999 | Rees | 326/27 |
| 5,920,210 | * 7/1999 | Kaplinsky | 327/112 |
| 6,018,256 | * 1/2000 | Kumagai et al. | 327/112 |
| 6,057,717 | * 5/2000 | Kawano et al. | 327/112 |
| 6,114,886 | * 9/2000 | Seo | 327/112 |

OTHER PUBLICATIONS

Nolan & Eyck, "Dynamic Output Control (DOC ™) Circuitry Technology and Applications" Texas Instruments SCEA009, pp. 1–14, Aug. 1998.

* cited by examiner

Primary Examiner—My-Trang Nu Ton
(74) Attorney, Agent, or Firm—Stuart T. Auvinen

(57) ABSTRACT

An output buffer for a line driver uses transmission gates for active termination. A large p-channel driver is pulsed on during a low-to-high output transition, but this driver is turned off once the output voltage reaches a threshold. A feedback circuit includes a sensing inverter that has its input connected to the output node. The sensing inverter causes the gate of the p-channel driver to be driven high once the output swings past the threshold. A similar n-channel driver transistor is pulsed on during a low-going output transition but is disabled by a feedback circuit that senses the output voltage falling below a threshold. A pullup transmission gate is also connected between the output and the power supply, while a pulldown transmission gate is connected between the output and ground. Each transmission gate contains a p-channel and a n-channel transistor in parallel. The sizes of the p-channel and n-channel transistors in the transmission gate is sufficiently small to provide a resistance of 25 to 30 ohms. Both transistors in the pullup transmission gate are turned on when the output is driven high, while both transistors of the pulldown transmission gate are turned on when the output is driven low. Having both n and p transistors of the transmission gate on provides a more linear resistance across the voltage swing of the output. Since termination of about 25–30 ohms is provided by the transmission gate, an external series resistor is not needed for dampening. When driving large capacitive loads, several nanoseconds of R-C delay can be saved.

20 Claims, 9 Drawing Sheets

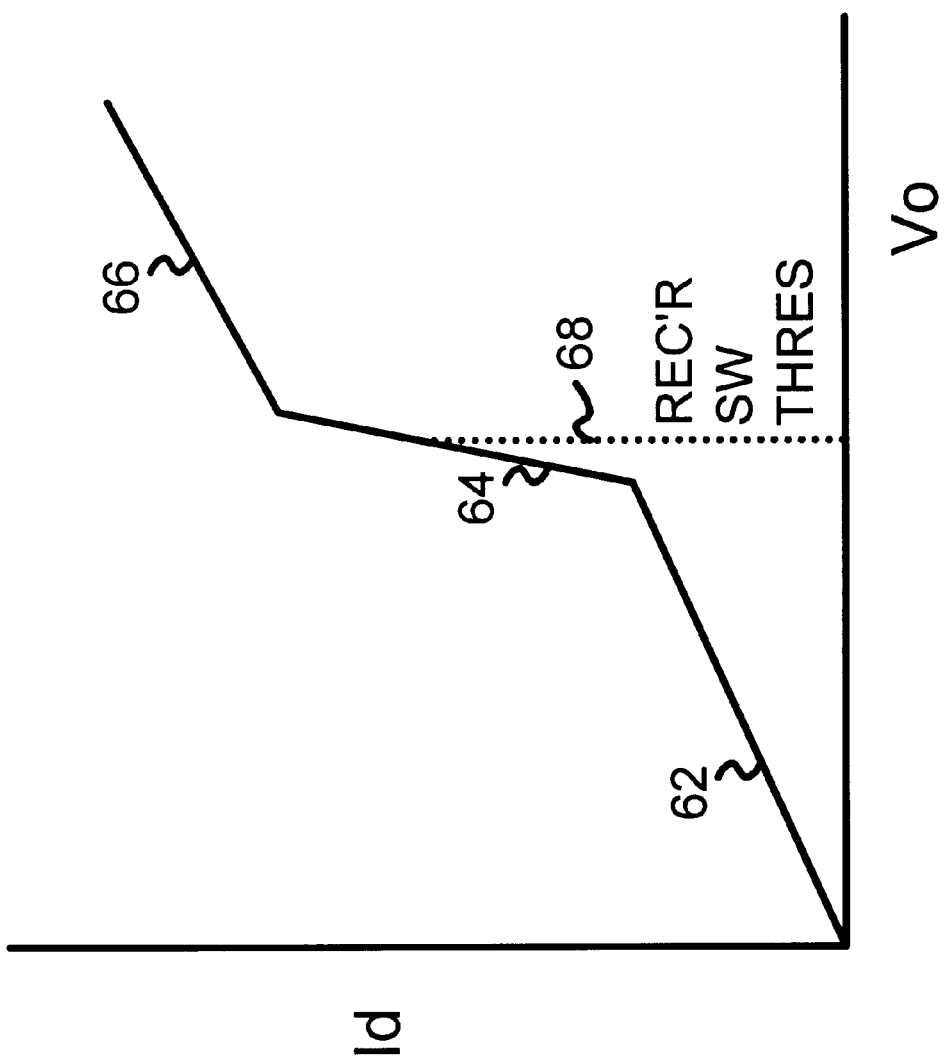

CMOS OUTPUT BUFFER WITH NEGATIVE FEEDBACK DYNAMIC-DRIVE CONTROL AND DUAL P,N ACTIVE-TERMINATION TRANSMISSION GATES

FIELD OF THE INVENTION

This invention relates to CMOS output buffers, and more particularly to low-noise and impedance-adjusting output buffers.

BACKGROUND OF THE INVENTION

Digital systems often use complementary metal-oxide-semiconductor (CMOS) circuits as interface or "glue" logic. Higher-performance systems require increased speed and current requirements for the glue logic. Higher current drive increases speed because load capacitances are more quickly charged or discharged. Unfortunately, unwanted noise often increases too.

CMOS chips with higher-drive output buffers often produce a type of noise known as ground bounce, due to rapid changes in current through the parasitic inductances of the integrated circuit (IC) package. These inductances resist changes in current by changing the voltages on power or ground supplies. Such voltage changes can falsely trigger logic within the IC device, or other devices in the system.

The rate of voltage change of the output, the edge rate, increases for these faster devices. The high edge rate can reflect off the ends of printed-circuit-board (PCB) wiring traces driven by the output buffer. These reflections produce voltage variations known as undershoot, overshoot, and ringing (oscillation). Careful layout of these wiring traces is needed to minimize trace-ends that can cause reflections. Termination devices such as resistors to ground at the ends of the traces are often used to absorb the reflection-causing wave front produced by the high edge rate.

FIG. 1 shows a memory module using a buffer or driver. Inputs to the memory module are buffered by driver 10. Driver 10 drives the input to synchronous dynamic-random-access memory (SDRAM) 12. SDRAMs require precise clock inputs for timing.

The output from driver 10 is distributed to the inputs of SDRAMs 12 by wiring traces on the printed-circuit board (PCB) of the memory module. These wiring traces have a small amount of resistance 16 that is distributed throughout the wiring trace. The input pins of SDRAMs 12 have a relatively large capacitance. Overall capacitance can reach 70 pF. Thus a significant R-C delay occurs, and driver 10 must have a high current drive to meet timing requirements for the memory module.

Dampening resistor 14 is sometimes used. Dampening resistor 14 is in series on the wiring trace between driver 10 and SDRAMs 12 rather than being a resistor to power or ground. Dampening resistors reduce or slow down the high edge rate as well as any reflections. Unfortunately, the speed of the output buffer is also reduced.

While discrete dampening resistors are often used, the output buffer of driver 10 itself provides some impedance, which also acts as a dampening resistor. Unfortunately, this impedance decreases with higher-current-drive output buffers. The lower impedance of these output buffers creates a greater mis-match between the output buffer's impedance and the impedance of the wiring trace.

A series resistance of about 33 ohms is used for dampening resistor 14. When driving a 70 pF load of inputs to SDRAM 12, an R-C delay of 2.3 ns occurs. As desired buffer speeds drop below 4 ns, this R-C delay is a significant design burden.

High speed requires high-drive output buffers. These high-drive buffers have impedances of perhaps only 5 ohms, far less than the 35 to 30 ohms required for a series dampening resistor. Thus the output impedance is not sufficient for the needed dampening resistance.

Power budgets also limit the quality of termination. Lower-impedance resistors consume much power. CMOS chips driving terminated lines can only sink or source a limited amount of current in the static or D.C. state.

FIG. 2 is a diagram of a waveform of a prior-art high-drive output buffer driving a PCB wiring trace. The high current drive of the output buffer produces a high edge rate that rapidly changes the output voltage from ground to the power-supply voltage, Vcc. The high edge rate produces a wave front that travels down the wiring trace and reflects off one or more ends. The reflected wave front then travels back up the wiring trace to the output buffer, and raises the voltage at the output buffer when the reflected wave arrives. The raised voltage is above Vcc and is known as an overshoot. This reflected wave then reverses direction and travels back to the end of the wiring trace, is reflected, and again reaches the output buffer, producing a series of both overshoots and undershoots, known as ringing. Since the reflected wave is dampened and loses energy at each reflection, the amplitude of the ringing gradually decreases. Low-going ringing (undershoot) is caused by a mis-match in impedance. Multiple reflections interfere with each other and cause the ringing.

When the output buffer switches from high to low, another high-edge rate wave travels down the wiring trace and is reflected back, producing undershoot and more ringing. This undershoot can cause ground bounce inside the output buffer's IC.

When the ringing, overshoot, or undershoot is large, logic can read a static signal as low when the static signal is actually high. For example, a static 3-volt signal input to another pin of the IC is a high signal, but when the internal ground of the IC bounces up from 0 volt to 2 volt, the static 3-volt signal appears to be a 1-volt signal, a low input. When the input signal is connected to a latch or flip-flop, the false low can be latched in, causing an error. Thus noise is a serious problem.

Several prior-art solutions to these problems are known. For example, Pierce et al., U.S. Pat. No. 5,319,252, assigned to Xilinx Inc. of San Jose, Calif., discloses an output buffer which gradually turns output buffers on and off so that there is no sharp discontinuity in the current flow. The output voltage is fed back to gradually turn off the output buffer at the end of the voltage transition. Lipp in U.S. Pat. No. 5,347,177, discloses a closed-loop trace which is driven by output buffers with level-sensitive impedance control.

Sharpe-Geisler, U.S. Pat. No. 5,438,277, assigned to Advanced Micro Devices of Sunnyvale, Calif., discloses an output buffer using two pull-down devices. A noisy (larger) pull-down device is connected to a noisy ground (having ground bounce) while a quiet (smaller) pull-down device is connected to a quiet ground. A one-shot triggered by an internal signal first switches on the noisy pull-down, then turns off the noisy pulldown and turns on the quiet pull-down. Kang, U.S. Pat. No. 5,410,262, assigned to Samsung, is a similar approach.

Output-buffer pulsing and neighbor sensing were disclosed by Kwong in U.S. Pat. Nos. 5,717,343 and 5,963,047, both and assigned to Pericom Semiconductor.

What is desired is an output buffer or driver with high current drive and high speed. It is desired to reduce noise from the fast edge rate, such as ringing, undershoot, overshoot, and ground bounce. It is desired to dynamically control the impedance of the output buffer to provide low impedance as the output voltage is rapidly changing, but high impedance when the reflected wave front is received to dampen the reflections. It is desired to provide an active termination that matches the trace resistance of a memory module clock line. It is desired to provide series resistance within the output buffer so that the external series dampening resistor can be eliminated. Active termination with relatively constant resistance across various voltage ranges is desired. A high-speed output buffer with low resistance during switching but higher resistance after switching is desired.

SUMMARY OF THE INVENTION

A high-drive output buffer with active termination has an output pad for connecting to an external output load. A pullup driver transistor is coupled to strongly drive the output pad to a higher voltage during a rising transition of the output pad, The pullup driver transistor is controlled by a pullup gate. A pulldown driver transistor is coupled to strongly drive the output pad to a lower voltage during a falling transition of the output pad. The pulldown driver transistor is controlled by a pulldown gate.

A sensor is coupled to the output pad. It detects when the output pad has been driven to a threshold voltage. The sensor disables the pullup driver transistor near an end of the rising transition. The sensor disables the pulldown driver transistor near an end of the falling transition.

A pullup transmission gate is coupled to the output pad. It provides a terminating impedance to the output pad after the end of the rising transition after sensor has disabled the pullup driver transistor. The pullup transmission gate is also for weakly driving the output pad to a higher voltage during the rising transition.

A pulldown transmission gate is coupled to the output pad. It provides a terminating impedance to the output pad after the end of the falling transition after sensor has disabled the pulldown driver transistor. The pulldown transmission gate is also for weakly driving the output pad to a lower voltage during the falling transition. Thus the output pad is terminated by the pullup transmission gate after the rising transition, but terminated by the pulldown transmission gate after the falling transition.

In further aspects of the invention the pullup transmission gate has an n-channel transistor with a gate controlled by a data signal. Its source is connected to a power supply and its drain is connected to the output pad. A p-channel transistor has a gate controlled by an inverse of the data signal. Its drain is connected to the power supply, and its source is connected to the output pad.

The pulldown transmission gate has an n-channel transistor with a gate controlled by the inverse of the data signal. Its source is connected to a ground, and its drain is connected to the output pad. A p-channel transistor has a gate controlled by the data signal. Its drain is connected to the ground, and its source is connected to the output pad. Thus impedance of the pullup transmission gate is more linear than impedance of a single transistor over a voltage range.

In still further aspects the pullup driver transistor is a p-channel transistor, and the pulldown driver transistor is an n-channel transistor.

In still further aspects the sensor has a sensing inverter with an input driven by the output pad. It generates a sensing signal. A NAND gate receives the sensing signal and the data signal. It initially drives the pullup gate to a low voltage at a start of the rising transition, but drives the pullup gate to a high voltage when the sensing inverter generates the sensing signal. A NOR gate receives the sensing signal and the data signal. It initially drives the pulldown gate to a high voltage at a start of the falling transition, but drives the pulldown gate to a low voltage when the sensing inverter generates the sensing signal.

BRIEF DESCRIPTION OF THE DRAWINGS

FIG. 7 is a I-V plot illustrating that low impedance occurs during switching.

DETAILED DESCRIPTION

The present invention relates to an improvement in variable-impedance output drivers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that the output impedance can be adjusted dynamically during a switching transition. During the transition, a low impedance can be provided as high current is delivered. However, near the end of the transition, the output impedance can be increased to 25–30 ohms, thus providing a series dampening resistance to absorb reflections. Thus the external dampening resistor can be eliminated.

Eliminating the external dampening resistor also eliminates the fixed R-C delay of as much as 2 ns. Instead, the effective resistance during the transition is 5 ohms, reducing the delay to 0.35 ns for a pF load. Once the transition is complete, the R-C delay again increases, since the output impedance increases to 30 ohms. However, by this time the output has been charged past the logic threshold, and thus the R-C delay does not increase the switching time.

The inventors have further realized that the variable impedance can be provided by pulsing the large driver transistors on and off during the transition. A feedback path is used to sense the output voltage. Once the output has been driven sufficiently to push the output voltage past a desired threshold, the large driver transistors turn off. Then an active termination is provided.

The inventors also realize that the active termination of about 25-30 ohms can be provided by full-CMOS transmission gates. Both an n-channel and a p-channel transistor continue to pull the output up after the large driver transistors is turned off. Likewise, another p-channel and n-channel transistor pair continue to pull the output low after the large pull-down driver transistor turns off.

Using both an n-channel and a p-channel transistor in parallel provides a more linear impedance that is less sensitive to voltage levels. Thus the transmission-gate active termination more closely matches the series resistance of an external dampening resistor than does a single n-channel or p-channel transistor.

The transmission gate can be activated early, allowing it to aid in switching the output. In particular, the n-channel transistor in the pull-up transmission gate can be turned on early to assist in pullup. Likewise, the p-channel transistor in the pull-down transmission gate can be turned on early to speed up pull-down.

Figure 1:
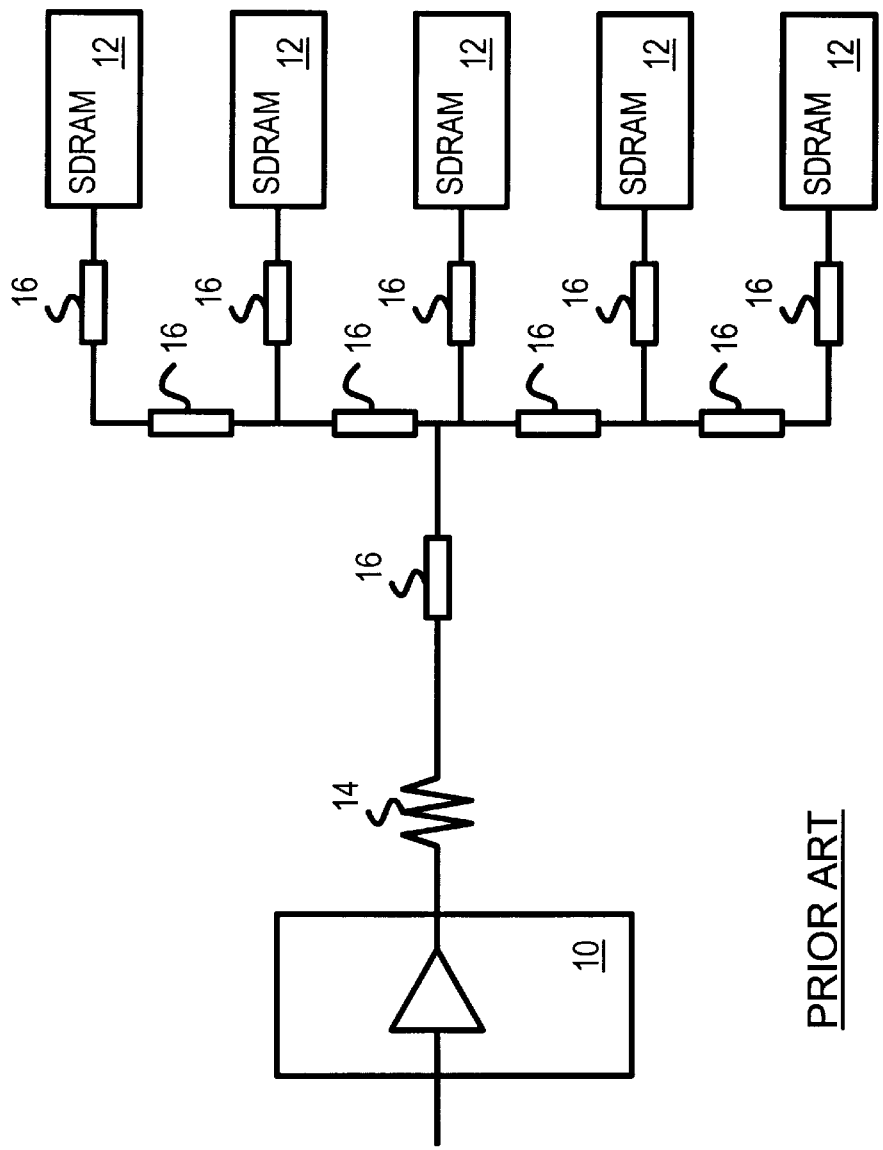
FIG. 1 shows a memory module using a buffer or driver.
Figure 2:
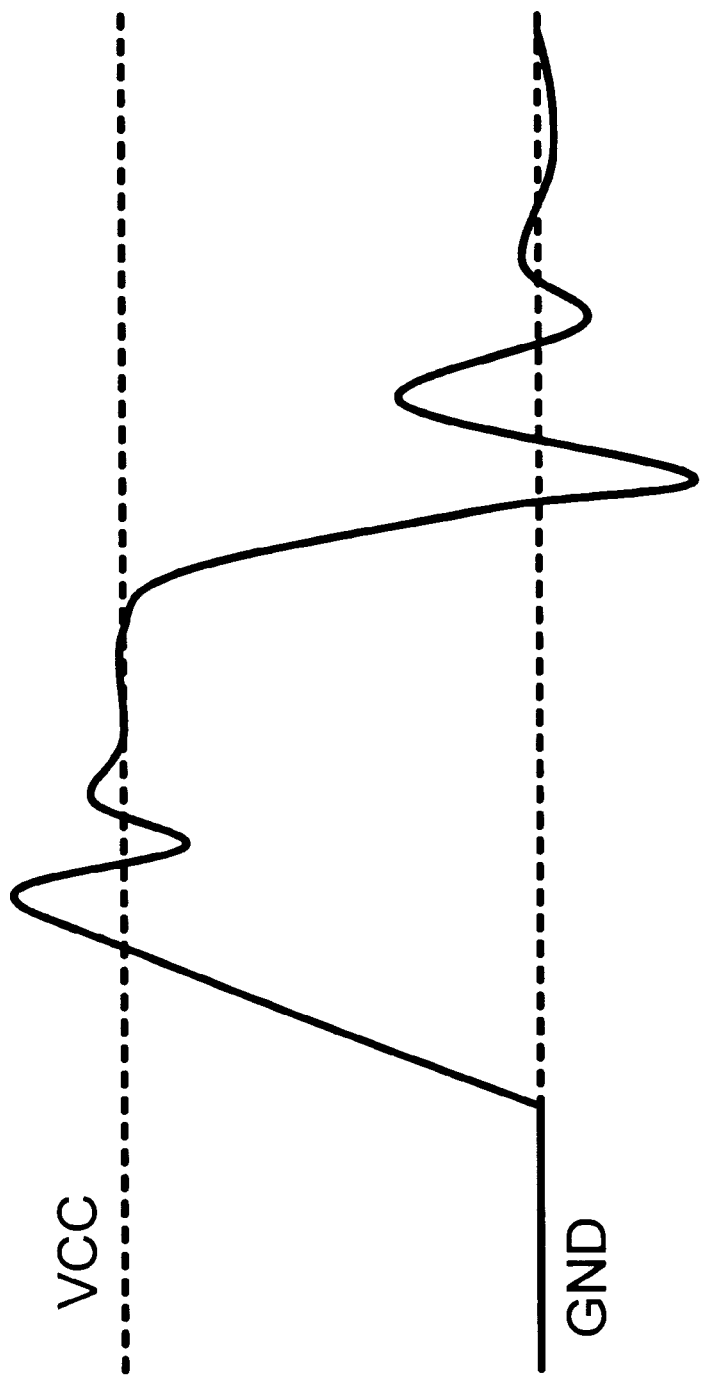
FIG. 2 is a diagram of a waveform of a prior-art high-drive output buffer driving a PCB wiring trace.
Figure 3:
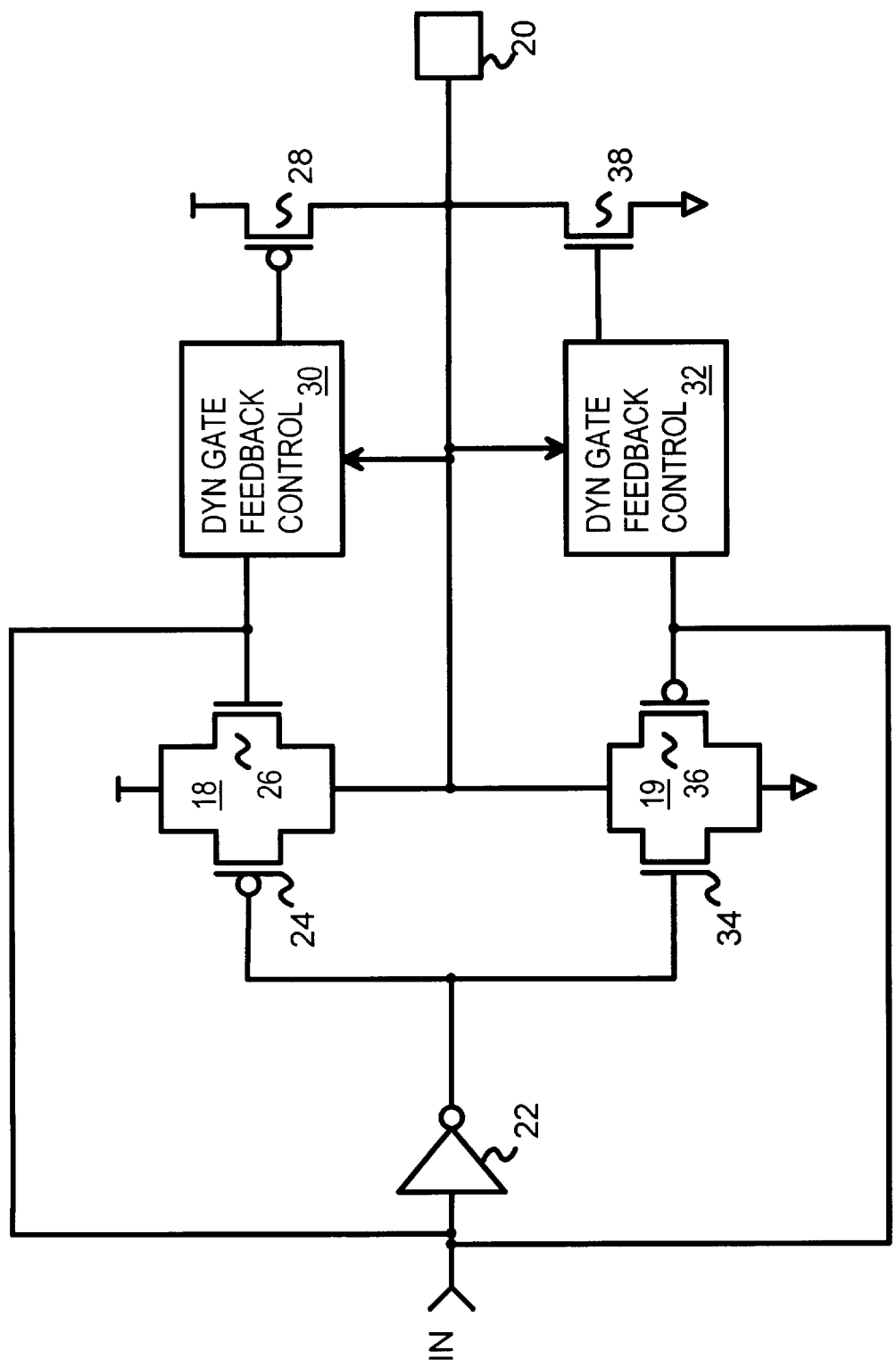
FIG. 3 is a diagram of an output buffer with feedback to vary impedance and transmission-gates for termination.

Transmission Gates Provide Termination—FIG. 3

FIG. 3 is a diagram of an output buffer with feedback to vary impedance and transmission-gates for termination. Output 20 is connected to a large-capacitance external load (not shown) that does not have an external dampening resistor. Output 20 is driven high by p-channel driver transistor 28 and driven low by n-channel driver transistor 38. The output voltage of output 20 is input to feedback control 30, 32, which disable driver transistors 28, 38 once enough voltage swing on output 20 occurs to reach a threshold. Thus driver transistors 28, 38 are turned on only briefly during the transition of output 20.

The amount of time that driver transistors 28, 38 are on depends on the current drive delivered and the capacitance and trace resistance of the load on output 20. Since feedback control 30, 32 sense the output voltage, the time that the driver transistors 28, 38 are on is adjusted for current Vcc and temperature conditions and output loading.

Active termination of output 20 is provided by pullup transmission gate 18 and pulldown transmission gate 19. Pullup transmission gate 18 contains n-channel transistor 26 and p-channel transistor 24, while pulldown transmission gate 19 contains n-channel transistor 34 and p-channel transistor 36. Thus full-CMOS transmission gates are used for active termination.

When output 20 is driven high, both transistors 24, 26 of pullup transmission gate 18 are turned on. When output 20 is driven low, both transistors 34, 36 of pulldown transmission gate 19 are turned on.

Operation

When output 20 is low and input IN goes high, output 20 is driven from low-to-high. IN first turns on n-channel transistor 26 in pullup transmission gate 18, which begins to pull output 20 up. P-channel driver transistor 28 is then turned on through feedback control 30. Since p-channel driver transistor 28 is much larger than n-channel transistor 26, the output is rapidly pulled high by p-channel driver transistor 28 with a low impedance.

Once input IN is propagated through inverter 22, p-channel transistor 24 turns on, so that both transistors in pullup transmission gate 18 are activated. Transistors 34, 36 in pulldown transmission gate 19 are turned off.

After output 20 has been driven to a voltage above a logic threshold, feedback control 30 disables driver transistor 28 by driving a high voltage to its gate. Once driver transistor 28 is shut off, the output impedance rises to the impedance through transmission gate 18, which remains on. Since transistors 24, 26 in transmission gate 18 are much smaller than driver transistor 28, the output impedance rises from 3–5 ohms to 25–30 ohms.

Since both n-channel transistor 26 and p-channel transistor 24 are in parallel, pulling output 20 up, both transistors 24, 26 are on during the transition. As the output voltage nears the power supply voltage (Vcc), n-channel transistor 26 becomes saturated and shuts off. However, p-channel transistors 24 remains on, pulling output 20 all the way up to Vcc.

The output impedance is the parallel combination of the impedances of transistors 24, 26, which vary with the output voltage. However, the individual impedances change in opposite directions: while the impedance (channel or ON resistance) of n-channel transistor 26 increases as the output voltage rises, the impedance of p-channel transistor 24 decreases. Thus the overall impedance of transmission gate 18 tends to remain constant, or at least more linear than just a single pullup transistor.

When input IN switches from high to low, output 20 is driven from high to low. Pullup transmission gate 18 is turned off. Pullup driver transistor 28 was already off, being disabled by feedback control 30 once the previous low-to-high transition ended. P-channel transistor 36 in pulldown transmission gate 19 is turned on first, and starts to pull output 20 low from Vcc. After the delay through inverter 22, n-channel transistor 34 is also turned on, so both transistors 34, 36 in pulldown transmission gate 19 pull output 20 low.

Feedback control 32 drives a high voltage to the gate of n-channel driver transistor 38, and once enabled, driver transistor 38 quickly pulls output 20 low. Once enough current is discharged from output 20, a low-going logic threshold of feedback control 32 is reached. Feedback control 32 drives a low voltage onto the gate of n-channel driver transistor 38, turning driver transistor 38 off.

Transistors 34, 36 in pulldown transmission gate 19 remain on, continuing to pull output 20 low until ground is reached. While p-channel transistor 36 becomes saturated and turns off once the output voltage falls below the n-channel transistor-threshold voltage (about 0.7 volts for a 0.35-micron process), n-channel transistor 34 remains on. A relatively constant impedance is provided by pulldown transmission gate 19.

Figure 4:
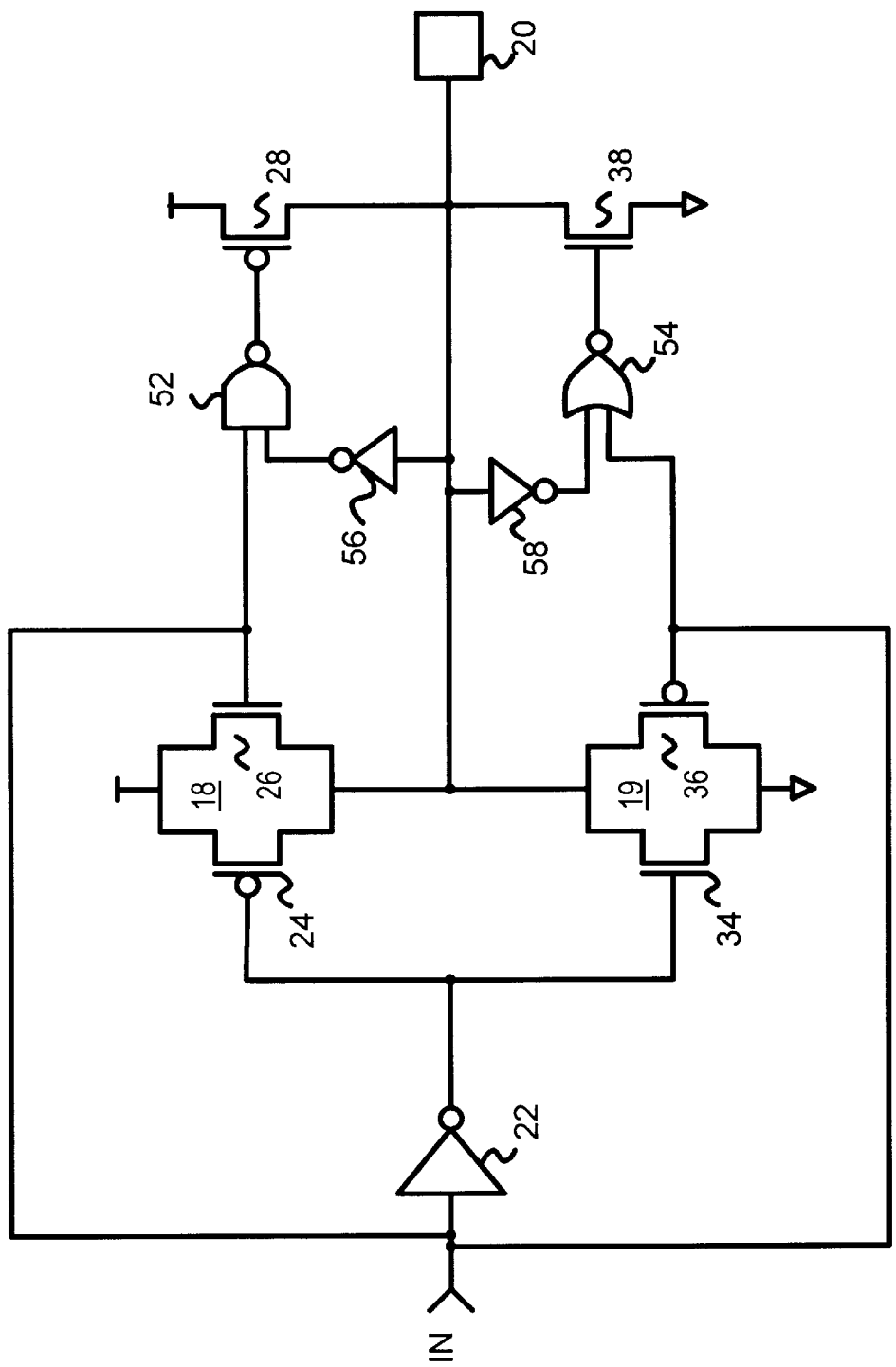
FIG. 4 shows a simple implementation of feedback control of the driver transistors.

Simple Feedback Control—FIG. 4

FIG. 4 shows a simple implementation of feedback control of the driver transistors. The devices with the same reference numbers in FIG. 3 as in FIG. 4 operate in the same manner as described before for FIG. 3.

Sensing inverters 56, 58 have their inputs connected to output 20 so that they sense the voltage of output 20. The device sizes and configuration of sensing inverters can be adjusted to a desired logic threshold and hysteresis added to more precisely control the turn off of the driver transistors.

When IN is high and output 20 is low but being driven high, p-channel driver transistor 28 is initially turned on, since both inputs to NAND gate 56 are high. Once a sufficiently high voltage of output 20 is reached, sensing inverter 56 drives its output low. The low is input to NAND gate 52. NAND gate 52 then drives the gate of p-channel driver transistor 28 high, turning off driver transistor 28.

When IN is low and output 20 is high but being driven low, n-channel driver transistor 38 is initially turned on, since both inputs to NOR gate 54 are low. Once a sufficiently low voltage of output 20 is reached, sensing inverter 58 drives its output high. The high is input to NOR gate 54. NOR gate 54 then drives the gate of n-channel driver transistor 38 low, turning off driver transistor 38.

The propagation delay through sensing inverters 56, 58 can be increased to keep driver transistors 28, 38 on longer, providing a faster rise and fall time of output 20. Additional delay buffers can be added between sensing inverter 56 and NAND gate 52, or between sensing inverter 58 and NOR gate 54. The timing of pullup and pulldown can be separately optimized for the intended output load and conditions.

Figure 5:
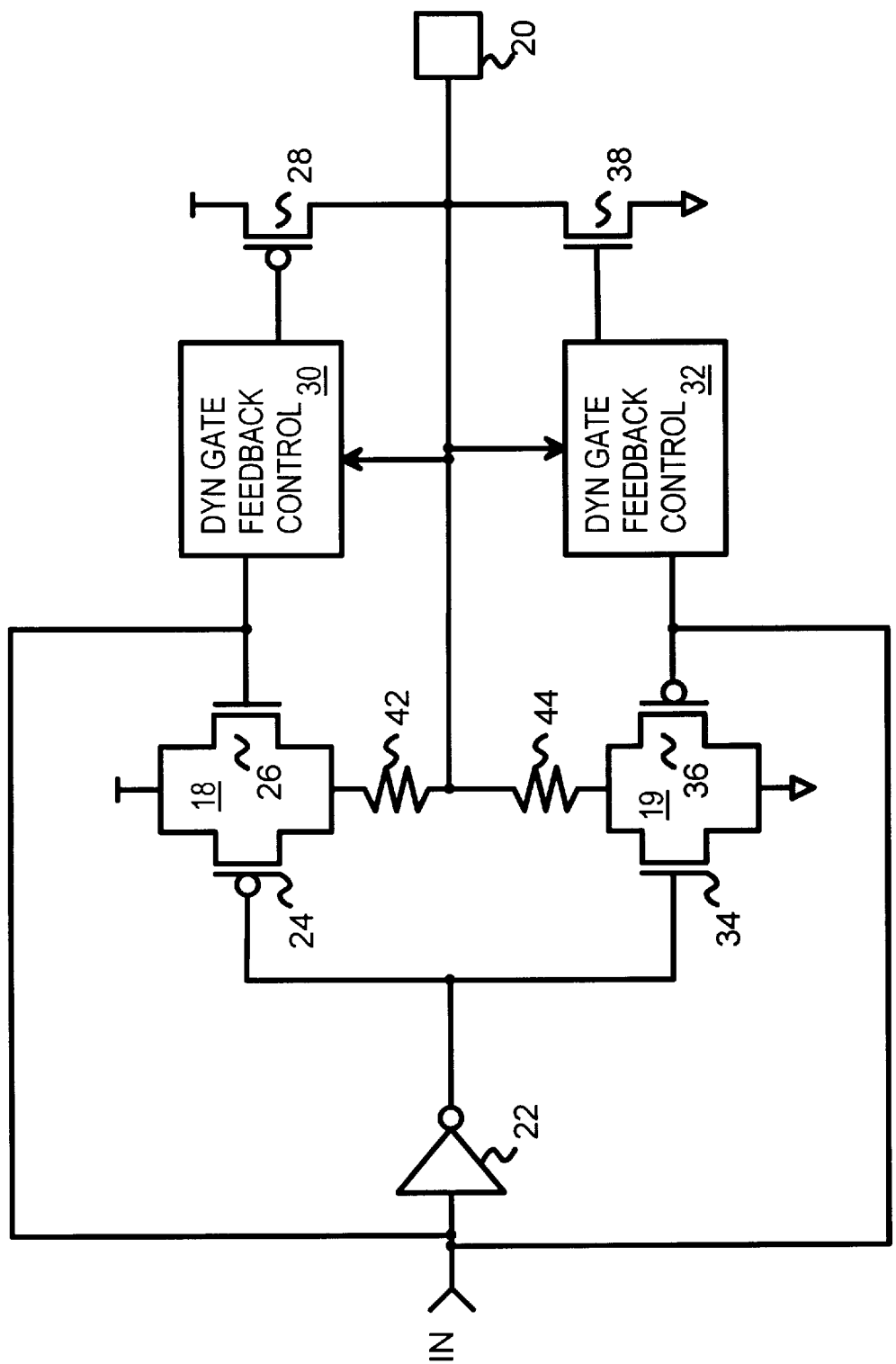
FIG. 5 shows that fixed resistors can be added in series with each active termination transmission gate.

FIG. 5 shows that fixed resistors can be added in series with each active termination transmission gate. The impedance of transmission gates 18, 19 may be too low, since a resistance of 33 ohm is usually needed for a series dampening resistor. Resistors 42, 44 may be integrated on the same integrated circuit (IC) substrate as transmission gates 18, 19 and driver transistors 28, 38. Resistor 42 increases the effective impedance of transmission gate 18, while resistor 44 increases the effective resistance of transmission gate 19. Resistors 42, 44 increase the output impedance since one of them is in series to output 20.

Resistors 42, 44 can be constructed in a variety of ways, such as using a polysilicon resistor or a substrate (diffusion) resistor. A resistance of only 10-30 ohms is needed for resistor 42, 44.

The inputs to feedback control 30, 32 are preferably taken from output 20 before resistors 42, 44. This minimizes feedback delay and removes the voltage drop across resistor 42,44 from the output sensing.

Figure 6:
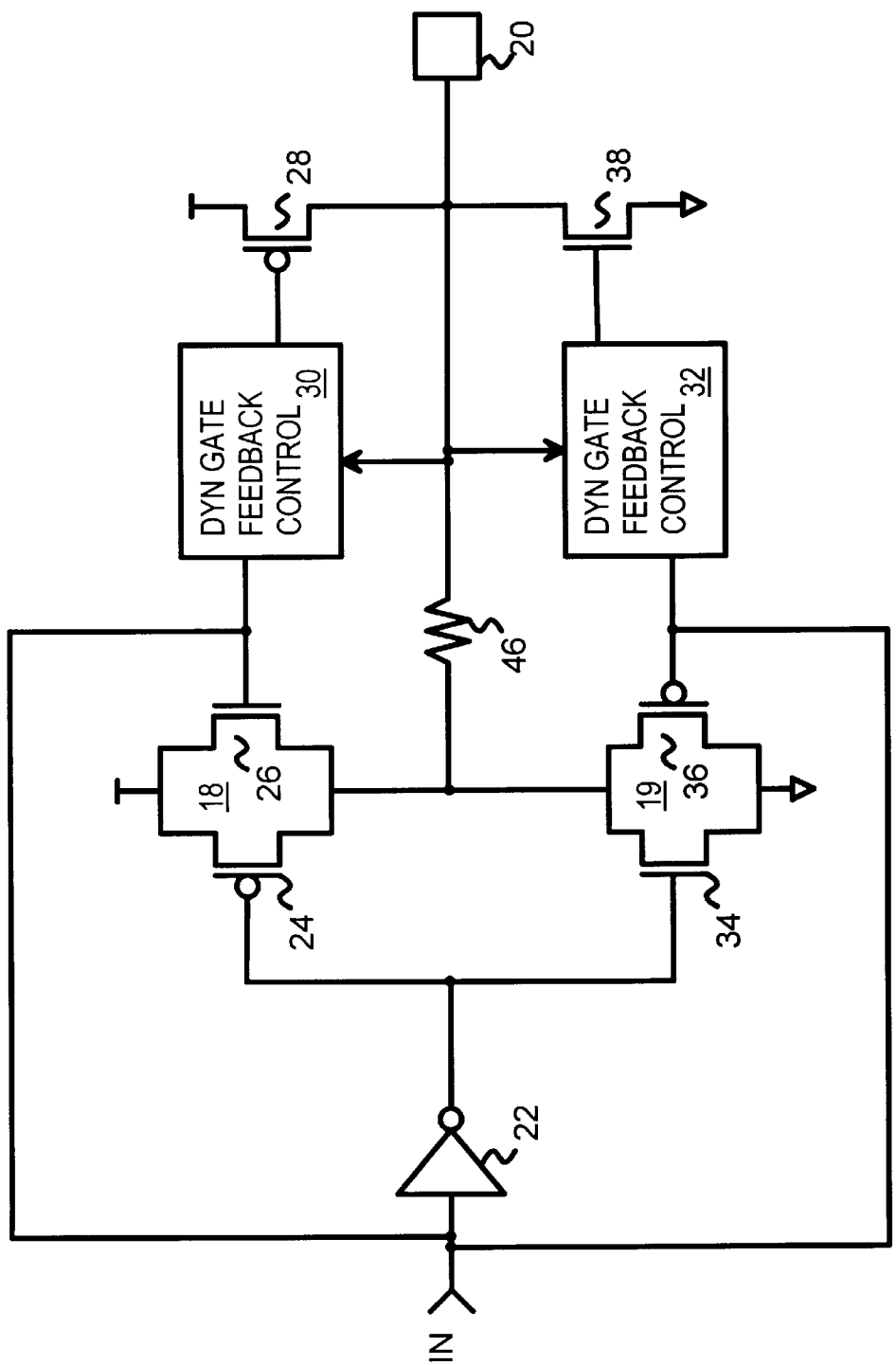
FIG. 6 shows that a fixed resistor can be added between the active termination and the output.

FIG. 6 shows that a fixed resistor can be added between the active termination and the output. The impedance of transmission gates 18, 19 may be too low, since a resistance of 33 ohm is usually needed for a series dampening resistor. Resistor 46 may be integrated on the same integrated circuit (IC) substrate as transmission gates 18, 19 and driver transistors 28, 38. Resistor 46 increases the effective impedance of transmission gates 18, 19 since it is in series to output 20.

Resistor 46 can be constructed in a variety of ways, such as using a polysilicon resistor or a substrate (diffusion) resistor. A resistance of only 10-30 ohms is needed for resistor 46. The inputs to feedback control 30, 32 are preferably taken from output 20 before resistor 46. This minimizes feedback delay and removes the voltage drop across resistor 46 from the output sensing.

Variable Impedance—FIG. 7

FIG. 7 is a I-V plot illustrating that low impedance occurs during switching. For low voltages, a high impedance (low slope of the current-voltage I-V curve) occurs in region 62, when the pulldown transmission gate acts as termination. For high voltages in region 66, a high impedance occurs since the pullup transmission gate acts as termination. The high impedance is about 25-30 ohms. In both regions 62, 66, the driver transistors have been turned off by the feedback control, since the output voltage is near the steady-state values. The slope of the I-V curve is relatively constant in regions 62, 66, since both a p-channel and a n-channel device are in parallel in the transmission gate.

During an output transition, the voltage is intermediate between Vcc and ground, region 64. One of the driver transistors is turned on, so the low impedance of the large driver transistor is shown to the output. This impedance is typically 3–5 ohms. The slope of the I-V curve flattens in region 64 as the impedance is lower.

The switching or logic threshold of devices such as DRAMs connected to the output falls within region 64 of the current-voltage curve. The thresholds of the feedback controls can be adjusted so that receiver switching threshold 68 is fully within region 64.

Figure 8A:
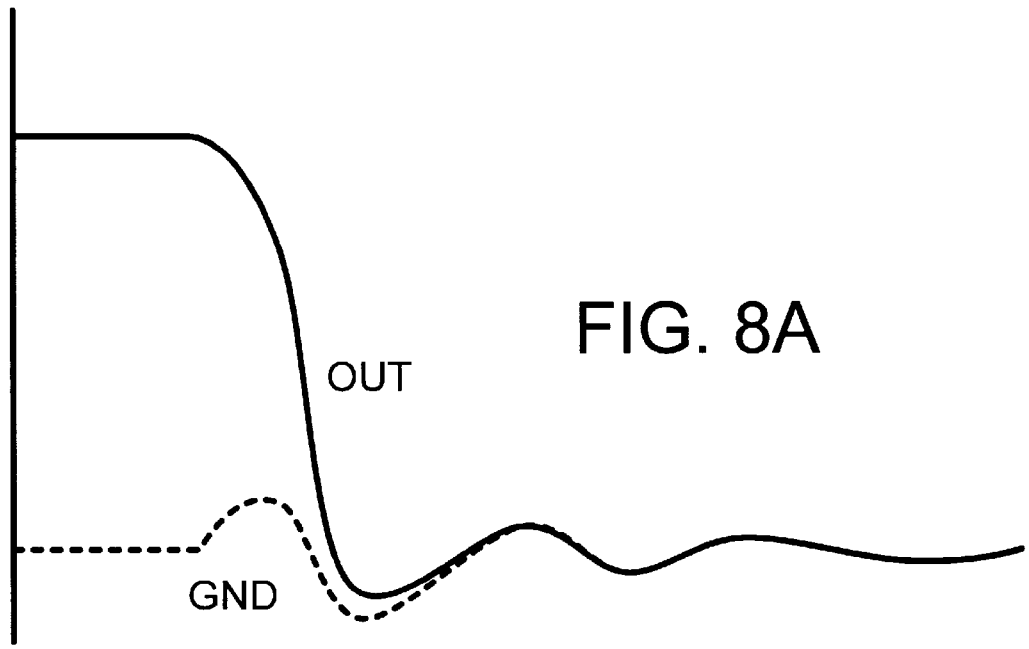
FIGS. 8A, 8B show switching waveforms of the variable-impedance output buffer with transmission gate active termination.

Switching Waveforms—FIGS. 8A,B

Figure 8B:
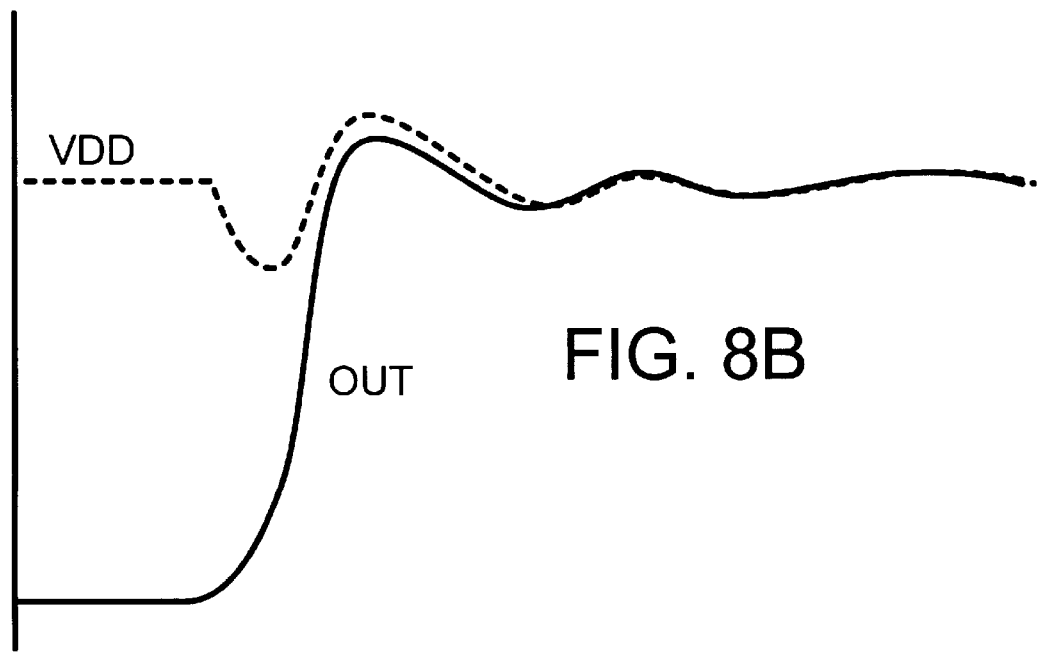

FIGS. 8A, 8B show switching waveforms of the variable-impedance output buffer with transmission gate active termination. In FIG. 8A, the output is driven low. During the transition, the large n-channel driver transistor is turned on, producing a very short fall time. However, this driver transistor is turned off before the end of the transition, before the first reflected wave reaches the output buffer.

The inductance of the ground wire to the IC chip causes the output to fall below ground and reflected waves cause oscillation or ringing above and below ground with a decreasing amplitude. Although the internal ground of the output buffer rises up and bounces somewhat, this ground disturbance is relatively small.

In FIG. 8B, the output is driven high. During the high-going transition, the large p-channel driver transistor is turned on, producing a very short rise time. This driver transistor is turned off before the end of the transition, before the first reflected wave reaches the output buffer.

Package impedance and reflected waves cause some ringing on the output, but the amplitude of the ringing is minimal. The internal power supply Vcc also bounces to some extent.

Figure 9:
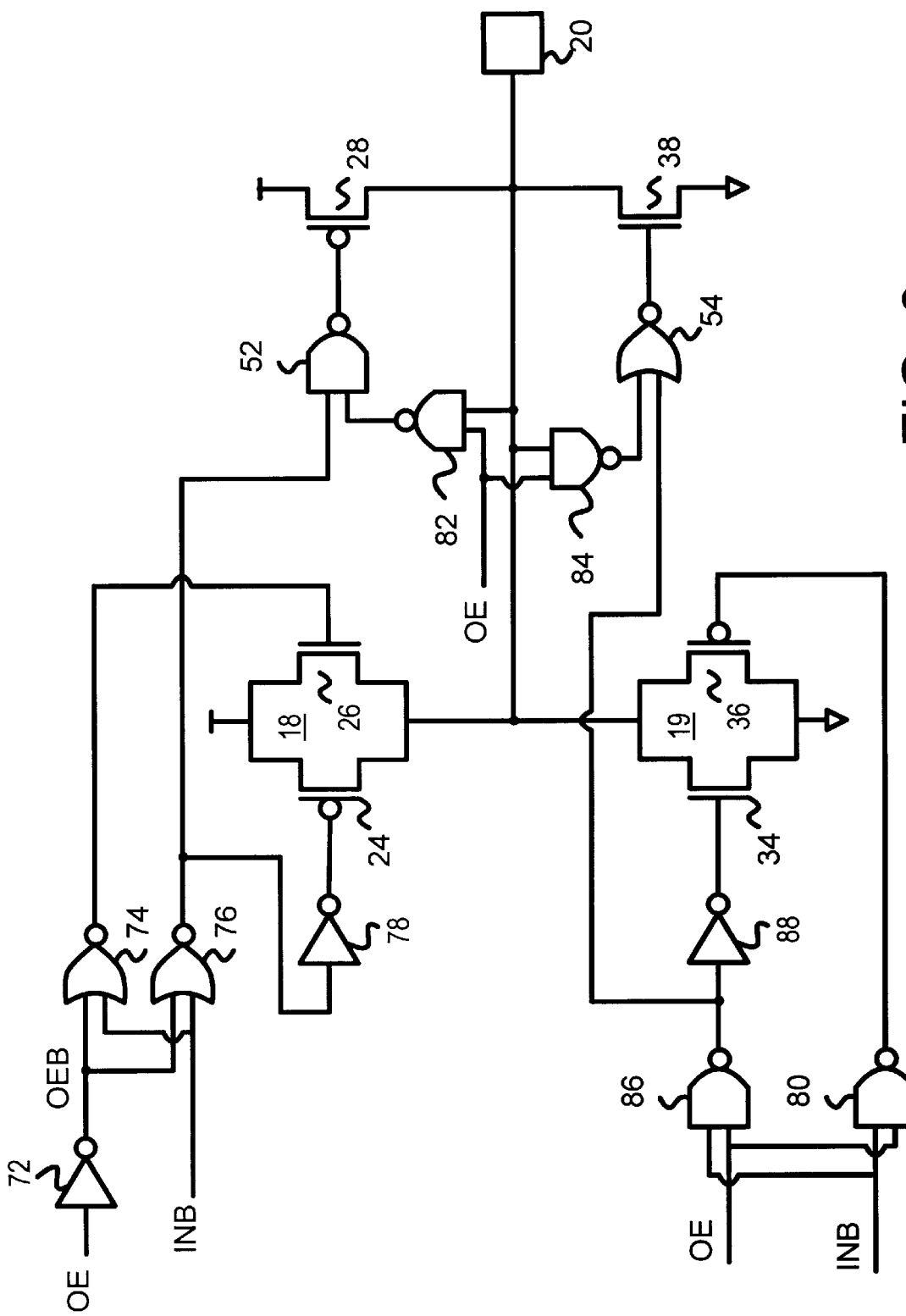
FIG. 9 is a schematic of a three-state output buffer with active termination provided by transmission gates.

Three-State Output Buffer—FIG. 9

FIG. 9 is a schematic of a three-state output buffer with active termination provided by transmission gates. Some applications require that the output buffer be disabled so that output 20 is left floating. An output-enable OE signal is driven low to place the output in the disconnected or high-impedance state. Driver transistors 28, 38 and transmission gates 18, 19 are all turned off in the disconnected state.

Output 20 is connected to a large-capacitance external load (not shown) that does not have an external dampening resistor. Output 20 is driven high by p-channel driver transistor 28 and driven low by n-channel driver transistor 38. Driver transistors 28, 38 are turned on only briefly during the transition of output 20, with p-channel driver transistor 28 being disabled through NAND gate 82 and NAND gate 52 once the output voltage rises to the threshold of NAND gate 82. Likewise, n-channel driver transistor 38 is disabled through NAND gate 84 and NOR gate 54 once the output voltage falls to the threshold of NAND gate 84. The output voltage of output 20 is input to sensing NAND gates 82, 84, which act as sensing inverters when OE is high.

When OE is low, sensing NAND gate 84 outputs a high to NOR gate 54, which drives a low voltage to the gate of n-channel driver transistors 38, disabling pull-down. P-channel driver transistor 28 is disabled by a high voltage output from NAND gate 52, since a low is output from NOR gate 76 when OE is low.

Pullup transmission gate 18 is disabled when OE is low. The gate of n-channel transistor 26 is driven low by NOR gate 74 when OEB is driven high by inverter 72. The gate of p-channel transistor 24 is driven high when OE is low through inverters 72, 78 and NOR gate 76.

Pulldown transmission gate 19 is also disabled when OE is low. The gate of n-channel transistor 34 is driven low by NAND gate 86 through inverter 88 when OE is low. The gate of p-channel transistor 36 is driven high when OE is low by NAND gate 80.

When OE is high, the output buffer is enabled. When input IN goes high, output 20 is driven high, first by n-channel transistor 26 in pullup transmission gate 18, then by p-channel transistor 24 in transmission gate 18, and finally by p-channel driver transistor 28. Once the output is pulled above the threshold of sensing NAND gate 82, driver transistor 28 is shut off and p-channel transistor 24 pulls output 20 the rest of the way to Vcc.

When OE is high, the output buffer is enabled. When input IN goes high, INB goes low and output 20 is driven high, first by NOR gate 74 turning on n-channel transistor 26 in pullup transmission gate 18, then by NOR gate 76 and inverter 78 turning on p-channel transistor 24 in transmission gate 18, and finally by p-channel driver transistor 28, which is turned on by NAND gate 52. Once the output is pulled above the threshold of sensing NAND gate 82, driver transistor 28 is shut off and p-channel transistor 24 pulls output 20 the rest of the way to Vcc.

Once driver transistor 28 is shut off, the output impedance rises to the impedance through transmission gate 18, which remains on. Since transistors 24, 26 in transmission gate 18 are much smaller than driver transistor 28, the output impedance rises from 3–5 ohms to 25–30 ohms.

When input IN goes low, INB goes high and output 20 is driven low, first by NAND gate 80 turning on p-channel transistor 36 in pulldown transmission gate 19, then by NAND gate 86 and inverter 88 turning on n-channel transistor 34. Finally n-channel driver transistor 38 is turned on by NOR gate 54. Once the output is driven below the threshold of sensing NAND gate 84, driver transistor 38 is shut off and n-channel transistor 34 pulls output 20 the rest of the way to ground.

Advantages of the Invention

The output buffer or driver has a high current drive and high speed. Noise from the fast edge rate, such as ringing, undershoot, overshoot, and ground bounce are reduced. The impedance of the output buffer is dynamically controlled to provide low impedance as the output voltage is rapidly changing, but high impedance when the reflected wave front is received to dampen the reflections. An active termination from the transmission gate matches the trace resistance of a memory module clock line. Series resistance is provided by the transmission gate within the output buffer so that the external series dampening resistor can be eliminated. Active termination with relatively constant resistance across various voltage ranges is achieved. The high-speed output buffer has low resistance during switching but higher resistance after switching.

Since the feedback control senses the output voltage, the time that the driver transistors are on is adjusted for current Vcc and temperature conditions and output loading. Better process, temperature, and supply-voltage tracking is achieved. Matching termination also reduces unwanted electromagnetic interference (EMI).

Alternate Embodiments

Several other embodiments are contemplated by the inventors. For example, the timing of the disabling of the driver transistors can be adjusted. The driver transistors and transmission gates can be provided with separate power-supply and ground busses to isolate output noise from internal circuits. Various device sizes can be used.

The resistors in series with the transmission gates can be implemented as diffusion resistors or as polysilicon resistors. Other technologies could also be used.

Current may flow in either direction, as negative current can flow from ground to the power supply. Thus the pull-up can drive a positive current to the output while the pulldown can drive a negative current to the output.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

Appendix—Device Sizes following are the W/L transistor sizes in microns for FIG. 4. L is 0.35 micron unless otherwise indicated.

| Reference # | W | L |
|---|---|---|
| 28 | 550 | 0.35 |
| 38 | 400 | 0.35 |
| 24 | 250 | 0.35 |
| 26 | 160 | 0.35 |
| 34 | 160 | 0.35 |
| 36 | 250 | 0.35 |

| Reference # | W(PMOS) | W(NMOS) |
|---|---|---|
| 56 | 10 | 5 |
| 58 | 5 | 2 |
| 52 | 30 | 30 |
| 54 | 20 | 20 |
| 22 | 60 | 30 |

We claim:

1. A high-drive output buffer with active termination comprising:

an output pad for connecting to an external output load;

a pullup driver transistor, coupled to strongly drive the output pad to a higher voltage during a rising transition of the output pad, the pullup driver transistor being controlled by a pullup gate;

a pulldown driver transistor, coupled to strongly drive the output pad to a lower voltage during a falling transition of the output pad, the pulldown driver transistor being controlled by a pulldown gate;

a sensor, coupled to the output pad, for detecting when the output pad has been driven to a threshold voltage, the sensor disabling the pullup driver transistor near an end of the rising transition, the sensor disabling the pulldown driver transistor near an end of the falling transition;

a pullup transmission gate, coupled to the output pad, for providing a terminating impedance to the output pad after the end of the rising transition after sensor has disabled the pullup driver transistor, the pullup transmission gate also for weakly driving the output pad to a higher voltage during the rising transition; and a pulldown transmission gate, coupled to the output pad, for providing a terminating impedance to the output pad after the end of the falling transition after sensor has disabled the pulldown driver transistor, the pulldown transmission gate also for weakly driving the output pad to a lower voltage during the falling transition, whereby the output pad is terminated by the pullup transmission gate after the rising transition, but terminated by the pulldown transmission gate after the falling transition.

2. The high-drive output buffer of claim 1 wherein the pullup transmission gate comprises:

an n-channel transistor having a gate controlled by a data signal, with a source connected to a power supply and a drain connected to the output pad;

a p-channel transistor having a gate controlled by an inverse of the data signal, with a drain connected to the power supply and a source connected to the output pad;

wherein the pulldown transmission gate comprises:

an n-channel transistor having a gate controlled by the inverse of the data signal, with a source connected to a ground and a drain connected to the output pad; and a p-channel transistor having a gate controlled by the data signal, with a drain connected to the ground and a source connected to the output pad, whereby impedance of the pullup transmission gate is more linear than impedance of a single transistor over a voltage range.

3. The high-drive output buffer of claim 2 further comprising:

a data inverter, having an input driven by the data signal, for generating the inverse of the data signal.

4. The high-drive output buffer of claim 3 wherein the pullup driver transistor is a p-channel transistor and wherein the pulldown driver transistor is an n-channel transistor.

5. The high-drive output buffer of claim 4 wherein the sensor comprises:

a sensing inverter having an input driven by the output pad, for generating a sensing signal;

a NAND gate, receiving the sensing signal and the data signal, for initially driving the pullup gate to a low voltage at a start of the rising transition, but for driving the pullup gate to a high voltage when the sensing inverter generates the sensing signal;

a NOR gate, receiving the sensing signal and the data signal, for initially driving the pulldown gate to a high voltage at a start of the falling transition, but for driving the pulldown gate to a low voltage when the sensing inverter generates the sensing signal.

6. The high-drive output buffer of claim 4 wherein the sensor comprises:

a sensing inverter having an input driven by the output pad, for generating a sensing signal;

a NAND gate, receiving the sensing signal and the data signal, for initially driving the pullup gate to a low voltage at a start of the rising transition, but for driving the a second sensing inverter, having an input driven by the output pad, for generating a second sensing signal; and a NOR gate, receiving the second sensing signal and the data signal, for initially driving the pulldown gate to a high voltage at a start of the falling transition, but for driving the pulldown gate to a low voltage when the second sensing inverter generates the second sensing signal.

7. The high-drive output buffer of claim 6 wherein the external output load is a large capacitive load;

wherein the output pad is directly connected to the external output load so that no external dampening resistor is connected between the output driver and the external output load;

whereby an external dampening resistor is eliminated by the first and second transmission gates that act as termination of the external output load.

8. An output driver for driving an output load connected to an output comprising:

a data input;

a data inverter, coupled to the data input, for generating an inverted data input;

a first transmission gate, coupled between the output and a power supply, the first transmission gate having a first n-channel transistor and a first p-channel transistor having channels coupled to conduct between the power supply and the output;

wherein a control gate of the first n-channel transistor is coupled to the data input and a control gate of the first p-channel transistor is coupled to the inverted data input;

a second transmission gate, coupled between the output and a ground, the second transmission gate having a second n-channel transistor and a second p-channel transistor having channels coupled to conduct between the ground and the output;

wherein a control gate of the second n-channel transistor is coupled to the inverted data input and a control gate of the second p-channel transistor is coupled to the data input;

a pullup driver transistor, having a channel coupled between the power supply and the output for raising a voltage of the output in response to a first gate signal;

a first sensing device, coupled to the output, for activating a first feedback signal when the output rises in voltage past a first threshold;

a first logic gate, receiving the first feedback signal and the data input, for generating the first gate signal to enable the pullup driver transistor when the data input rises, but for ending the first gate signal to disable the pullup driver transistor before the output reaches a voltage of the power supply;

a pulldown driver transistor, having a channel coupled between the ground and the output for lowering the voltage of the output in response to a second gate signal;

a second sensing device, coupled to the output, for activating a second feedback signal when the output falls in voltage past a second threshold; and a second logic gate, receiving the second feedback signal and the data input, for generating the second gate signal to enable the pulldown driver transistor when the data input falls, but for ending the second gate signal to disable the pulldown driver transistor before the output reaches a voltage of the ground, whereby driver transistors are pulsed but a transmission gate remains on after an output transition.

9. The output driver of claim 8 wherein the first and second sensing devices are inverters; and wherein the first logic gate is a NAND gate and wherein the second logic gate is a NOR gate.

10. The output driver of claim 9 wherein the pullup driver transistor is a p-channel transistor having a larger current drive than the first p-channel transistor; and wherein the pulldown driver transistor is an n-channel transistor having a larger current drive than the second n-channel transistor.

11. The output driver of claim 8 wherein the output load is a large capacitive load;

wherein the output is directly connected to the output load so that no external dampening resistor is connected between the output driver and the output load;

whereby an external dampening resistor is eliminated by the first and second transmission gates that act as termination of the output load.

12. The output driver of claim 8 wherein the first n-channel transistor is turned on before the pullup driver transistor when the output is driven high.

13. A variable-impedance output driver comprising:

an input for indicating when an output is to be driven low and when an output is to be driven high by the output driver;

a p-channel driver transistor, coupled to pull the output up toward a power supply voltage of a power supply;

first feedback means, having an input coupled to sense an output voltage of the output, for driving a high voltage onto a gate of the p-channel driver transistor to disable the p-channel driver transistor once the output voltage rises above a threshold during a high-going transition;

a pullup transmission gate, coupled between the output and the power supply voltage, for conducting current between the output and the power supply, the pullup transmission gate having an n-channel transistor and a p-channel transistor in parallel;

first control means, responsive to the input and coupled to the pullup transmission gate and to the first feedback means, for initially enabling the p-channel driver transistor and for driving a high voltage onto a gate of the n-channel transistor in the pullup transmission gate, and for driving a low voltage onto a gate of the p-channel transistor in the pullup transmission gate when the input switches to indicate that the output be driven high;

wherein both the n-channel transistor and the p-channel transistor in the pullup transmission gate are enabled when the input indicates that the output be driven high, the pullup transmission gate providing a terminating impedance to the output once the p-channel driver transistor is disabled by the first feedback means;

an n-channel driver transistor, coupled to pull the output down toward a ground;

second feedback means, having an input coupled to sense the output voltage, for driving a low voltage onto a gate of the n-channel driver transistor to disable the n-channel driver transistor once the output voltage falls below a threshold during a low-going transition;

a pulldown transmission gate, coupled between the output and the ground, for conducting current between the output and the ground, the pulldown transmission gate having an p-channel transistor and a n-channel transistor in parallel; and second control means, responsive to the input and coupled to the pulldown transmission gate and to the second feedback means, for initially enabling the n-channel driver transistor and for driving a high voltage onto a gate of the n-channel transistor in the pulldown transmission gate, and for driving a low voltage onto a gate of the p-channel transistor in the pulldown transmission gate when the input switches to indicate that the output be driven low;

wherein both the p-channel transistor and the n-channel transistor in the pulldown transmission gate are enabled when the input indicates that the output be driven low, the pulldown transmission gate providing a terminating impedance to the output once the n-channel driver transistor is disabled by the second feedback means;

whereby active termination is provided by the pullup transmission gate when the output is driven high, but is provided by the pulldown transmission gate when the output is driven low.

14. The variable-impedance output driver of claim 13 wherein the first feedback means comprises a sensing inverter having an input connected to the output, the sensing inverter driving a NAND gate driven by the input, the NAND gate driving the gate of the p-channel driver transistor;

wherein the second feedback means comprises a sensing inverter having an input connected to the output, the sensing inverter driving a NOR gate driven by the input, the NOR gate driving the gate of the n-channel driver transistor.

15. The variable-impedance output driver of claim 14 wherein the first control means and the second control means comprise an inverter connected to the input for generating an inverted input, the inverted input driving the gate of the p-channel transistor in the pullup transmission gate and driving the gate of the n-channel transistor of the pulldown transmission gate, the input directly driving the gate of the n-channel transistor in the pullup transmission gate and driving the gate of the p-channel transistor of the pulldown transmission gate, whereby the input and the inverted input drive the pullup and pulldown transmission gates.

16. The variable-impedance output driver of claim 15 wherein an output impedance of the output driver has a low-impedance during an initial portion of a switching transition of the output but the output impedance rises to a higher impedance value of the terminating impedance once the driver transistors are both disabled, whereby output impedance is adjusted by the output driver.

17. The variable-impedance output driver of claim 16 wherein the p-channel driver transistor and the n-channel driver transistor each have an impedance to the output of less than 5 ohms;

wherein the pullup transmission gate and the pulldown transmission gate each have a terminating impedance to the output of 25 to 30 ohms;

whereby the output impedance rises to about 30 ohms once the driver transistors are disabled.

18. The variable-impedance output driver of claim 17 further comprising:

a series resistor coupled between the output and the pulldown transmission gate to increase the terminating impedance of the pulldown transmission gate.

19. The variable-impedance output driver of claim 18 further comprising:

a second series resistor coupled between the output and the pullup transmission gate to increase the terminating impedance of the pullup transmission gate.

20. The variable-impedance output driver of claim 17 further comprising:

output-enable means, coupled to the first and second feedback means and to the pullup and pulldown transmission gates, for disabling the p-channel driver transistor, the n-channel driver transistor, the pullup transmission gate, and the pulldown transmission gate in response to an output-enable signal indicating that the output driver is not to drive the output, whereby the output is isolated from the transmission gates and drivers.

* * * * *